(12) United States Patent
Sun

(10) Patent No.: US 12,342,675 B2
(45) Date of Patent: Jun. 24, 2025

(54) DISPLAY SUBSTRATE, METHOD FOR MANUFACTURING THE SAME, AND DISPLAY APPARATUS

(71) Applicant: BOE TECHNOLOGY GROUP CO., LTD., Beijing (CN)

(72) Inventor: Li Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 503 days.

(21) Appl. No.: 17/800,790

(22) PCT Filed: Oct. 11, 2021

(86) PCT No.: PCT/CN2021/123068
§ 371 (c)(1),
(2) Date: Aug. 18, 2022

(87) PCT Pub. No.: WO2022/111076
PCT Pub. Date: Jun. 2, 2022

(65) Prior Publication Data
US 2023/0105154 A1    Apr. 6, 2023

(30) Foreign Application Priority Data

Nov. 30, 2020  (CN) .......................... 202011374352.5

(51) Int. Cl.
*H10K 50/842* (2023.01)
*H10D 86/40* (2025.01)
(Continued)

(52) U.S. Cl.
CPC ......... *H10K 50/8426* (2023.02); *H10D 86/40* (2025.01); *H10D 86/60* (2025.01);
(Continued)

(58) Field of Classification Search
None
See application file for complete search history.

(56) References Cited

U.S. PATENT DOCUMENTS

| 2008/0174712 A1 | 7/2008 | Kim et al. |
| 2009/0103054 A1* | 4/2009 | Ichikawa ............. G02B 27/126 353/33 |
| 2021/0159289 A1 | 5/2021 | Liu |

FOREIGN PATENT DOCUMENTS

| CN | 108091675 A | 5/2018 |
| CN | 109196525 A * | 1/2019 ........... G02B 6/0026 |

(Continued)

*Primary Examiner* — Michael Lebentritt
(74) *Attorney, Agent, or Firm* — WHDA, LLP

(57) ABSTRACT

A display substrate, a method for manufacturing the display substrate, and a display apparatus are provided. The display substrate includes: a base substrate; a partition structure, where the partition structure has a first side and a second side opposite to each other; and a light guide structure arranged proximate to the partition structure. At least one light guide structure is located on the first side of the partition structure and configured to guide a light onto a part, which faces the light guide structure, of a side surface of the partition structure on the first side; and the partition structure has a first inclined side surface located on the first side, where the first inclined side surface extends distally from the base substrate and is inclined away from the second side, and a first space is formed between the first inclined side surface and the base substrate.

20 Claims, 15 Drawing Sheets

(51) Int. Cl.
  *H10D 86/60*    (2025.01)
  *H10K 50/856*   (2023.01)
  *H10K 50/858*   (2023.01)
  *H10K 50/86*    (2023.01)
  *H10K 59/12*    (2023.01)
  *H10K 59/121*   (2023.01)
  *H10K 59/122*   (2023.01)
  *H10K 71/00*    (2023.01)

(52) U.S. Cl.
  CPC ......... *H10K 50/856* (2023.02); *H10K 50/858* (2023.02); *H10K 50/865* (2023.02); *H10K 59/1213* (2023.02); *H10K 59/122* (2023.02); *H10K 71/00* (2023.02); *H10K 59/1201* (2023.02)

(56) References Cited

FOREIGN PATENT DOCUMENTS

| | | | | | |
|---|---|---|---|---|---|
| CN | 109461834 | A | | 3/2019 | |
| CN | 109791325 | A | * | 5/2019 | ........... A61B 5/1172 |
| CN | 109791599 | A | * | 5/2019 | ............. G06F 21/32 |
| CN | 110112201 | A | | 8/2019 | |
| CN | 110678997 | A | | 1/2020 | |
| CN | 112467054 | A | | 3/2021 | |
| WO | WO-2022111076 | A1 | * | 6/2022 | ......... H01L 27/1214 |

* cited by examiner

DISPLAY SUBSTRATE, METHOD FOR MANUFACTURING THE SAME, AND DISPLAY APPARATUS

CROSS-REFERENCE TO RELATED APPLICATION

This application is a Section 371 National Stage Application of International Application No. PCT/CN2021/123068, filed on Oct. 11, 2021, which claims priority to Chinese Patent Application No. 202011374352.5 entitled "DISPLAY SUBSTRATE, METHOD FOR MANUFACTURING THE SAME, AND DISPLAY APPARATUS" and filed on Nov. 30, 2020, and the disclosure of which are hereby incorporated in their entirety by reference.

TECHNICAL FIELD

The present disclosure relates to a field of display technology, in particular to a display substrate, a method for manufacturing the same, and a display apparatus.

BACKGROUND

An organic light-emitting diode (OLED) display apparatus has advantages such as light weight and thinness, active light emission, wide viewing angle, fast response, low energy consumption, and flexible display. Compared with a conventional liquid crystal display (LCD) apparatus, the OLED display apparatus may provide more vivid colors and a larger color gamut. In an organic light emitting display apparatus, a light-emitting material layer of an organic light-emitting device (OLED) is generally formed of a metal material with an active chemical property. The above-mentioned metal material is prone to react with water and oxygen, which may cause the photoelectric property of the material to be changed, thereby leading a failure of the OLED device.

The above information disclosed in this section is only for the understanding of the background of a technical concept of the present disclosure. Therefore, the above information may contain information that does not constitute a related art.

SUMMARY

In an aspect, a display substrate is provided, including:
a base substrate, including a display area and an encapsulation area surrounding the display area, where the encapsulation area is configured to accommodate a sealant;
a partition structure disposed on the base substrate and located in the encapsulation area, where the partition structure has a first side and a second side opposite to each other, one of the first side and the second side is proximate to the display area, and the other of the first side and the second side is away from the display area; and
a light guide structure disposed on the base substrate, where the light guide structure is located in the encapsulation area and arranged proximate to the partition structure,
where at least one light guide structure is located on the first side of the partition structure and configured to guide light onto a part, which faces the light guide structure, of a side surface of the partition structure on the first side; and
where the partition structure has a first inclined side surface located on the first side, where the first inclined side surface extends distally from the base substrate and is inclined away from the second side, and a first space is formed between the first inclined side surface and the base substrate.

According to some exemplary embodiments, the light guide structure includes: a first light reflection layer disposed on the base substrate; a first light guide layer disposed on a side of the first light reflection layer away from the base substrate; and a second light reflection layer disposed on a side of the first light guide layer away from the base substrate.

According to some exemplary embodiments, the light guide structure further includes: a second light guide layer disposed between the first light reflection layer and the first light guide layer; and a third light guide layer disposed between the first light guide layer and the second light reflection layer, where a refractive index of a material of the first light guide layer is greater than a refractive index of a material of the second light guide layer, and the refractive index of the material of the first light guide layer is greater than a refractive index of a material of the third light guide layer.

According to some exemplary embodiments, the light guide structure further includes a light absorption layer disposed on a side of the second light reflection layer away from the base substrate.

According to some exemplary embodiments, each of the light absorption layer, the second light reflection layer, and the third light guide layer has an opening, where the opening of the light absorption layer, the opening of the second light reflection layer, and the opening of the third light guide layer are communicated with each other to expose at least a part of the first light guide layer.

According to some exemplary embodiments, the first light guide layer has a spacing groove dividing the first light guide layer into a first light guide sub-layer and a second light guide sub-layer, and an orthographic projection of the spacing groove on the base substrate falls within each of orthographic projections of the openings of the light absorption layer, the second light reflection layer, and the third light guide layer on the base substrate.

According to some exemplary embodiments, the partition structure includes a top surface away from the base substrate, the base substrate includes a first surface facing the partition structure, and a vertical distance from an end of the first inclined side surface away from the base substrate to the first surface is less than or equal to a vertical distance from the top surface to the first surface.

According to some exemplary embodiments, the partition structure further includes a second inclined side surface located on the second side, where the second inclined side surface is inclined away from the first side in a direction from the side proximate to the base substrate to the side away from the base substrate, and a second space is formed between the second inclined side surface and the base substrate.

According to some exemplary embodiments, a vertical distance from an end of the second inclined side surface away from the base substrate to the first surface is less than or equal to the vertical distance from the top surface to the first surface.

According to some exemplary embodiments, the first light guide layer includes a top surface away from the base substrate, and a vertical distance from the top surface of the first light guide layer to the first surface is less than each of the vertical distance from the end of the first inclined side surface away from the base substrate to the first surface and the vertical distance from the end of the second inclined side surface away from the base substrate to the first surface.

According to some exemplary embodiments, the display substrate further includes a plurality of pixel units disposed in the display area of the base substrate, and each of the pixel units includes a pixel driver circuit, and a light-emitting device electrically connected to the pixel driver circuit, where the light-emitting device includes a first electrode, a second electrode, and a light-emitting layer disposed between the first electrode and the second electrode; and where the pixel driver circuit includes at least one thin film transistor disposed on the base substrate, and the thin film transistor includes an active layer, a gate electrode, a source electrode, and a drain electrode; and where the display substrate further includes: a light-shielding layer disposed on a side of the active layer proximate to the base substrate; a first conductive layer disposed on a side of the active layer away from the base substrate, where the gate electrode is located in the first conductive layer; a second conductive layer disposed on a side of the first conductive layer away from the base substrate, where the source electrode and the drain electrode are located in the second conductive layer; a third conductive layer disposed on a side of the second conductive layer away from the base substrate, where the second electrode is located in the third conductive layer; a first insulation layer disposed between the active layer and the first conductive layer; a second insulation layer disposed between the first conductive layer and the second conductive layer; and a third insulation layer disposed between the second conductive layer and the third conductive layer, where the second insulation layer is located in a same layer as the first light guide layer.

According to some exemplary embodiments, one of the light-shielding layer and the first conductive layer is located in a same layer as the first light reflection layer; and/or the first insulation layer is located in a same layer as the second light guide layer; and/or the third insulation layer is located in a same layer as the third light guide layer; and/or one of the second conductive layer and the third conductive layer is located in a same layer as the second light reflection layer.

According to some exemplary embodiments, the display substrate includes at least two partition structures, and at least one light guide structure is located between two partition structures.

According to some exemplary embodiments, the display substrate includes at least two light guide structures, at least one light guide structure is located on the first side of the partition structure, and at least one light guide structure is located on the second side of the partition structure.

According to some exemplary embodiments, the display substrate further includes a pixel definition layer located on a side of the first electrode away from the base substrate; and the partition structure and the pixel definition layer are located in a same layer.

According to some exemplary embodiments, the partition structure includes a positive photoresist material.

According to some exemplary embodiments, the display substrate further includes a sealant located in the encapsulation area, and an orthographic projection of the sealant on the base substrate covers each of an orthographic projection of the partition structure on the base substrate and an orthographic projection of the light guide structure on the base substrate.

According to some exemplary embodiments, each of the second electrode and the light-emitting layer of the light-emitting device is broken at at least the first inclined side surface.

In another aspect, a display apparatus is provided, including: the display substrate described above; and a second substrate facing the display substrate, where the encapsulation area is provided with a sealant in contact with the display substrate and the second substrate respectively.

In another aspect, a method for manufacturing a display substrate is provided, including:
  providing a base substrate, where the base substrate includes a display area and an encapsulation area surrounding the display area;
  forming a light guide structure on the base substrate, where the light guide structure is located in the encapsulation area, and has a first side surface and a second side surface opposite to each other, one of the first side surface and the second side surface is proximate to the display area, and the other of the first side surface and the second side surface is away from the display area;
  coating a positive photoresist material onto the base substrate, where the positive photoresist material covers the display area and the encapsulation area; and
  forming a partition structure in the encapsulation area by a patterning process,
  where the forming a partition structure in the encapsulation area by a patterning process includes:
  irradiating light to a part of the positive photoresist material and to the light guide structure, through an opening of a mask,
  under a guidance of the light guide structure, a part of the light is emitted from the first side surface and the second side surface of the light guide structure to be irradiated to a part of the positive photoresist material facing the first side surface and the second side surface; and
  performing a development process on the exposed positive photoresist material to from the partition structure in the encapsulation area, such that: the partition structure has a first side and a second side facing each other, the partition structure has a first inclined side surface located on the first side, the first inclined side surface is inclined away from the second side in a direction from a side proximate to the base substrate to a side away from the base substrate, and a first space is formed between the first inclined side surface and the base substrate, where one of the first side and the second side is proximate to the display area, and the other of the first side and the second side is away from the display area.

According to some exemplary embodiments, the forming a light guide structure on the base substrate includes: forming a first light reflection layer on the base substrate; forming a first light guide layer on a side of the first light reflection layer away from the base substrate; and forming a second light reflection layer on a side of the first light guide layer away from the base substrate.

According to some exemplary embodiments, the forming a light guide structure on the base substrate includes: forming a second light guide layer between the first light reflection layer and the first light guide layer; and forming a third light guide layer between the first light guide layer and the second light reflection layer, where a refractive index of a material of the first light guide layer is greater than a refractive index of a material of the second light guide layer, and the refractive index of the material of the first light guide layer is greater than a refractive index of a material of the third light guide layer.

According to some exemplary embodiments, the forming a light guide structure on the base substrate further includes: forming a light absorption layer on a side of the second light reflection layer away from the base substrate.

According to some exemplary embodiments, the forming a light guide structure on the base substrate further includes: forming an opening in each of the light absorption layer, the second light reflection layer, and the third light guide layer, such that the opening of the light absorption layer, the opening of the second light reflection layer, and the opening of the third light guide layer are communicated with each other to expose at least a part of the first light guide layer; and the irradiating light to a part of the positive photoresist material and to the light guide structure, through an opening of a mask includes: irradiating light to the first light guide layer through the opening of the mask and the communicated openings, such that the light is introduced into the first light guide layer.

According to some exemplary embodiments, the forming a light guide structure on the base substrate further includes: forming a spacing groove in the first light guide layer so that the spacing groove divides the first light guide layer into a first light guide sub-layer and a second light guide sub-layer, where the first light guide sub-layer has a first side wall facing the second light guide sub-layer, and the second light guide sub-layer has a second side wall facing the first light guide sub-layer; and irradiating the light to the light guide structure through the opening of the includes: irradiating the light to the first light guide layer through the opening of the mask and the communicated openings, so that the light enters the first light guide sub-layer through the first side wall and enters the second light guide sub-layer through the second side wall.

According to some exemplary embodiments, a pixel definition layer is further formed in the display area in the patterning process.

According to some exemplary embodiments, the manufacturing method further includes: forming a light-emitting functional layer on a side of the pixel definition layer away from the base substrate by an evaporation process, where the light-emitting functional layer is broken at at least the first inclined side surface.

According to some exemplary embodiments, the manufacturing method further includes: forming a sealant in the encapsulation area of the base substrate, where an orthographic projection of the sealant on the base substrate covers each of an orthographic projection of the partition structure on the base substrate and an orthographic projection of the light guide structure on the base substrate.

BRIEF DESCRIPTION OF THE DRAWINGS

By describing exemplary embodiments of the present disclosure in detail with reference to the drawings, features and advantages of the present disclosure will become more apparent.

DETAILED DESCRIPTION OF EMBODIMENTS

Figure 1:
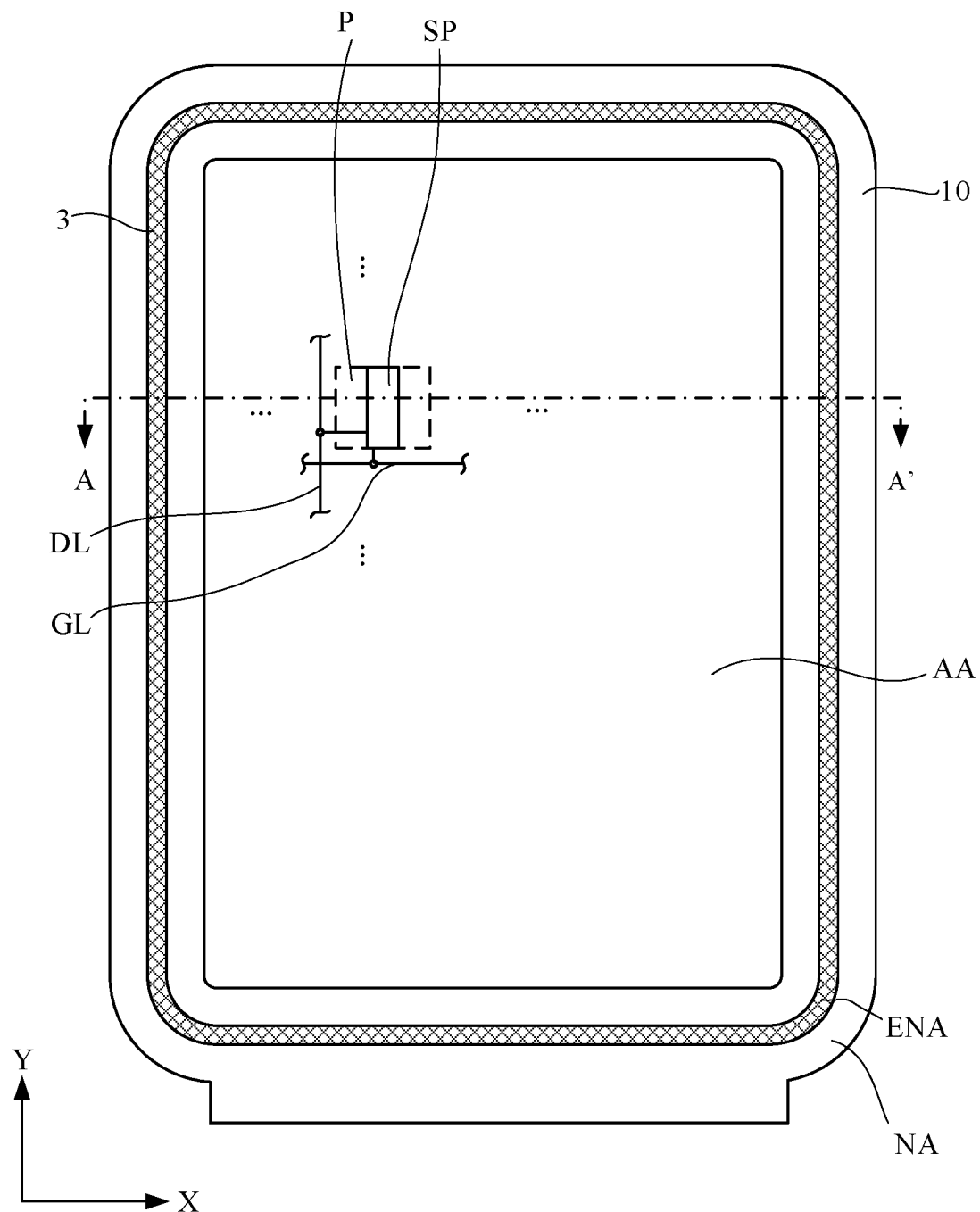
FIG. 1 shows a top view of a display panel according to some exemplary embodiments of the present disclosure.

In order to make objectives, technical solutions and advantages of the present disclosure clearer, the technical solutions of embodiments of the present disclosure are clearly and completely described below with reference to the drawings. Obviously, the described embodiments are only a part rather than all of embodiments of the present disclosure. Based on embodiments of the present disclosure, all additional embodiments obtained by those of ordinary skill in the art without carrying out inventive effort fall within the scope of protection of the present disclosure.

It will be noted that, in the drawings, for purposes of clarity and/or description, a size and a relative size of an element may be enlarged. Accordingly, a size and a relative size of each element do not have to be limited to those shown in the drawings. In the specification and drawings, the same or similar reference numerals indicate the same or similar components.

When an element is described as being "on", "connected to" or "coupled to" another element, the element may be directly on, directly connected to, or directly coupled to the other element, or an intermediate element may be provided. However, when an element is described as being "directly on", "directly connected to" or "directly coupled to" another element, no intermediate element is provided. Other terms and/or expressions used to describe the relationship between elements, such as "between" and "directly between", "adjacent" and "directly adjacent", "on" and "directly on", should be interpreted in a similar manner. In addition, the term "connection" may refer to a physical connection, an electrical connection, a communication connection, and/or a fluid connection. In addition, an X-axis, Y-axis and Z-axis are not limited to three axes of a rectangular coordinate system, and may be interpreted in a broader meaning. For example, the X-axis, the Y-axis and the Z-axis may be perpendicular to each other, or may represent different directions that are not perpendicular to each other. According to the present disclosure, "at least one of X, Y and Z" and "at least one selected from a group consisting of X, Y and Z" may be interpreted as only X, only Y, only Z, or any combination of two or more of X, Y and Z, such as XYZ, XYY, YZ and ZZ. As used herein, the term "and/or" includes any and all combinations of one or more of the listed related items.

It will be noted that although the terms "first", "second", and so on may be used herein to describe various components, members, elements, regions, layers and/or parts, these components, members, elements, regions, layers and/or parts should not be limited by these terms. Rather, these terms are used to distinguish a component, member, element, region, layer and/or part from another. Thus, for example, a first component, a first member, a first element, a first region, a first layer and/or a first part discussed below may be referred to as a second component, a second member, a second element, a second region, a second layer, and/or a second part without departing from teachings of the present disclosure.

For ease of description, spatial relationship terms, such as "upper", "lower", "left", "right", etc. may be used herein to describe the relationship between one element or feature and another element or feature as shown in the figure. It will be understood that the spatial relationship terms are intended to cover other different orientations of the device in use or operation in addition to the orientation described in the figure. For example, if the device in the figure is turned upside down, an element or feature described as "below" or "under" another element or feature will be oriented "above" or "on" the other element or feature.

Those skilled in the art should understand that, unless otherwise specified, the expression "height" or "thickness" herein refers to a size of a surface of each film layer which is arranged in a direction perpendicular to a display substrate, that is, a size along a light-emitting direction of the display substrate, or called a size in a normal direction of a display apparatus.

Unless otherwise specified, the expression "patterning process" herein includes at least steps of photoresist coating, exposure, development, and so on. The expression "a patterning process" means a process of forming patterned layers, components, members and so on by using a mask.

It will be noted that the expressions "the same layer", "arranged in the same layer" or similar expressions refer to a layer structure formed by first using the same film forming process to form a film layer for forming specific patterns, and then using the same mask to pattern the film layer by using a patterning process. Depending on the specific patterns, the patterning process may include multiple exposure, development or etching processes, and the specific patterns in the formed layer structure may be continuous or discontinuous. These specific patterns may also be located at different heights or have different thicknesses. That is, elements or film layers in the same layer generally contain the same material and are formed by the same patterning process.

Unless otherwise specified, the expression "electrically connected" herein may mean that two components or elements are directly electrically connected. For example, a component or element A is in direct contact with a component or element B, and an electrical signal may be transmitted between the two. It may also mean that two components or elements are electrically connected through a conductive medium such as a conductive wire. For example, a component or element A is electrically connected to a component or element B through a conductive wire so as to transmit an electrical signal between the two components or elements. Alternatively, it may also mean that two components or elements are electrically connected through at least one electronic component. For example, a component or element A is electrically connected to a component or element B through at least one thin film transistor so as to transmit an electrical signal between the two components or elements.

An Embodiment of the present disclosure provides at least a display substrate, including: a base substrate, including a display area and an encapsulation area surrounding the display area, the encapsulation area is configured to accommodate a sealant; a partition structure disposed on the base substrate and located in the encapsulation area, where the partition structure has a first side and a second side opposite to each other, one of the first side and the second side is proximate to the display area, and the other of the first side and the second side is away from the display area; and a light guide structure disposed on the base substrate, where the light guide structure is located in the encapsulation area and arranged proximate to the partition structure. At least one light guide structure is located on the first side of the partition structure and configured to guide a light onto a part, which faces the light guide structure, of a side surface of the partition structure on the first side. The partition structure has a first inclined side surface located on the first side, where the first inclined side surface extends distally from the base substrate and is inclined away from the second side, and a first space is formed between the first inclined side surface and the base substrate. With such a structure, an encapsulation reliability of the display substrate may be improved.

Figure 2:
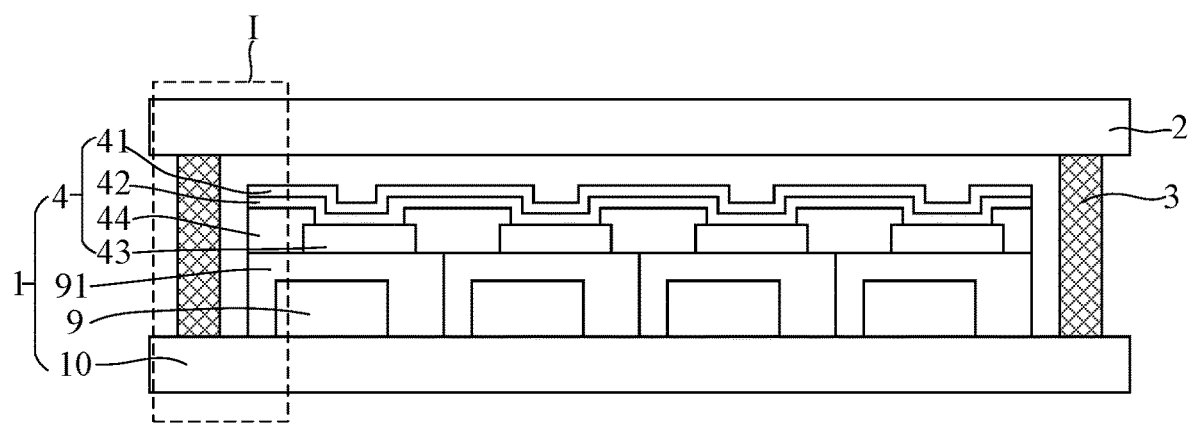
FIG. 2 shows a sectional view of a display panel taken along line AA' in FIG. 1 according to some exemplary embodiments of the present disclosure.

FIG. 1 shows a top view of a display panel according to some exemplary embodiments of the present disclosure. FIG. 2 shows a sectional view of a display panel taken along line AA' in FIG. 1 according to some exemplary embodiments of the present disclosure. Referring to FIG. 1 and FIG. 2 in combination, the OLED display panel may include a first substrate 1, and a second substrate 2 facing the first substrate 1. For example, the first substrate 1 may be an array substrate, and the second substrate 2 may be a cover plate formed of, for example, glass, an organic material, etc.

For example, the OLED display panel may further include a sealant 3 arranged between the first substrate 1 and the second substrate 2. The sealant 3 is arranged in a ring shape in a peripheral area of the first substrate 1, that is, a ring of sealant 3 is arranged in a peripheral area of the first substrate 1. In this way, the sealant 3 may prevent an intrusion of water vapor and oxygen, maintain a cell thickness of the peripheral area of the display panel, and bond the first substrate and the second substrate. For example, a gap between the first substrate and the second substrate may be further filled with a filler which may be made of a resin material. By providing the filler and the sealant 3, an encapsulation structure of Dam plus Filler is achieved. It will be noted that the embodiments of the present disclosure are not limited to such encapsulation structure, and other types of encapsulation structures may be used in the embodiments of the present disclosure in a case of no conflict.

Referring to FIG. 1, the display substrate (for example, the first substrate 1) may include a base substrate 10. For example, the base substrate 10 may be formed of glass, plastic, polyimide, or other materials. The base substrate 10 includes a display area AA and a peripheral area (or referred to as a non-display area) NA located on at least one side of the display area AA (for ease of description, this side is referred to as a first side). The peripheral area NA may include an encapsulation area ENA and other peripheral areas.

It will be noted that, unless otherwise specified, the expression "encapsulation area" herein refers to an area covered by the sealant 3.

Continuing to refer to FIG. 1, the first substrate 1 may include a plurality of pixel units P (schematically shown by a dashed frame in FIG. 1) disposed in the display area AA. The plurality of pixel units P may be arranged in an array in a first direction X and a second direction Y on the base substrate 10. Each of the pixel units P may further include a plurality of sub-pixels, such as a red sub-pixel, a green sub-pixel, and a blue sub-pixel. A sub-pixel SP is schematically shown in FIG. 1.

It will be noted that in the drawings, the pixel unit and sub-pixel are schematically shown in rectangular shapes, but this does not constitute a limitation on the shapes of the pixel units and sub-pixels included in the display panel provided by the embodiments of the present disclosure.

The first substrate 1 may further include a light-emitting device, such as an OLED device 4. As shown in FIG. 2, the OLED device 4 includes a first electrode 41, a second electrode 43 facing the first electrode 41, and a light-emitting layer 42 between the first electrode 41 and the second electrode 43.

One of the first electrode 41 and the second electrode 43 is an anode electrode, and the other one of the first electrode 41 and the second electrode 43 is a cathode electrode. For example, the first electrode 41 may be a transparent cathode. For example, it may be formed of a transparent conductive material, which may include indium tin oxide (ITO), indium zinc oxide (IZO), and the like. The second electrode 43 may be a reflective anode. For example, it may be formed of a metal material, which may include alloys such as magnesium aluminum alloy (MgAl), lithium aluminum alloy (LiAl), etc., or single metals such as magnesium, aluminum, lithium, etc. The light-emitting layer 42 may have a multi-layer structure, for example, it may include a multilayer structure including a hole injection layer, a hole transport layer, an organic light-emitting layer, an electron transport layer, and an electron injection layer.

It will be noted that the OLED device 4 may adopt an active drive or a passive drive. A passive drive OLED array substrate includes a cathode electrode and an anode electrode, a part where the anode electrode and the cathode electrode overlap with each other may emit light, and the driver circuit may be externally mounted by a connection method such as a tape carrier package or a chip-on-glass. In an active drive OLED array substrate, each pixel may be provided with a pixel driver circuit. The pixel driver circuit may include a thin film transistor with a switching function (that is, a switching transistor), a thin film transistor with a driving function (that is, a driving transistor), and a charge storage capacitor. In addition, the pixel driver circuit may further include other types of thin film transistors with a compensation function. It will be understood that in the embodiments of the present disclosure, the display panel may be provided with various types of known pixel driver circuits, which will not be described in detail here.

For example, as shown in FIG. 2, the first substrate 1 includes a driver circuit layer 9. The above-mentioned pixel driver circuit may be disposed in the driver circuit layer 9. An insulation layer 91 may be disposed between the driver circuit layer 9 and the OLED device 4. The insulation layer 91 may be a single insulation film layer or a stacked layer including a plurality of insulation film layers.

The first substrate 1 may further include various signal lines disposed on the base substrate 10. The various signal lines include a scanning line, a data line, an ELVDD power line, an ELVSS power line and the like, so as to provide various signals such as a control signal, a data signal, and a power voltage to the pixel driver circuit in each sub-pixel. In the embodiment shown in FIG. 1, a scanning line GL and a data line DL are schematically shown. The scanning line GL and the data line DL may be electrically connected to the sub-pixel.

Figure 3:
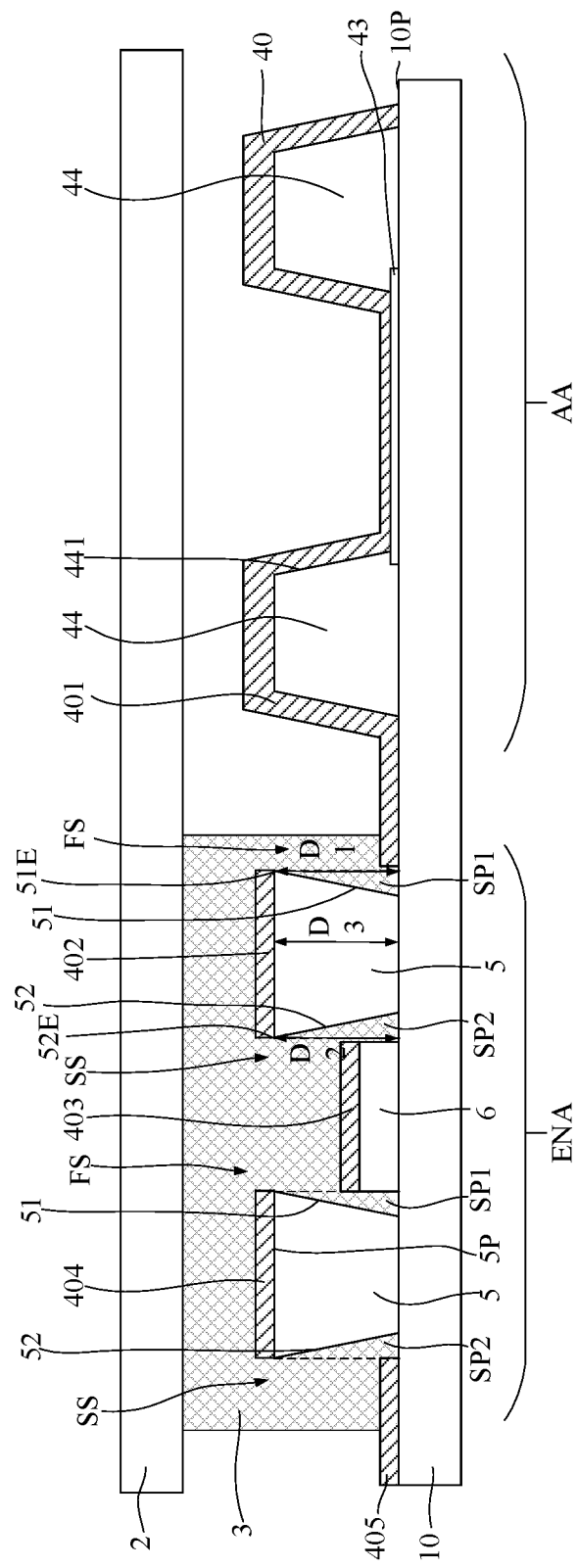
FIG. 3 shows a partially enlarged view of part I of FIG. 2, in which a sectional structure of the display substrate in an encapsulation area according to an embodiment of the present disclosure is schematically shown.

FIG. 3 shows a partially enlarged view of part I of FIG. 2, in which a sectional structure of the display substrate in the encapsulation area according to embodiments of the present disclosure is schematically shown. Referring to FIG. 1 to FIG. 3 in combination, the first substrate 1 may include a partition structure 5 and a pixel definition layer 44. The partition structure 5 is located in the encapsulation area ENA. An orthographic projection of the sealant 3 on the base substrate 10 covers an orthographic projection of the partition structure 5 on the base substrate 10. The pixel definition layer 44 is located in the display area AA. For example, the pixel definition layer 44 may include a plurality of openings 441 respectively corresponding to a plurality of sub-pixels. That is, at least some of the OLED devices 4 of the plurality of sub-pixels are respectively located in the plurality of openings 441.

It will be noted that two partition structures 5 are schematically shown in FIG. 3, but this does not constitute a limitation on the number of partition structure(s) 5 included in the display substrate provided by the embodiments of the present disclosure. In other embodiments, the display substrate may be provided with less (e.g., 1) or more (e.g., 3, 4, 5 or more) partition structures 5.

In the embodiment shown in FIG. 3, a second electrode 43 and a light-emitting functional layer 40 are schematically shown. For example, the light-emitting functional layer 40 may include at least a light-emitting layer 42, or the light-emitting functional layer 40 may include a light-emitting layer 42 and a second electrode 41.

Continuing to refer to FIG. 3, a section of each partition structure 5 has a shape of an inverted trapezoid. Specifically, each partition structure 5 has a first side FS and a second side SS that are opposite to each other. One of the first side FS and the second side SS is proximate to the display area AA, and the other one of the first side FS and the second side SS is away from the display area AA. In FIG. 3, the first side FS that is proximate to the display area AA is taken as an example for description. Certainly, the second side SS may be configured to be proximate to the display area AA, and the first side FS may be configured to be away from the display area AA. The partition structure 5 has a first inclined side surface 51 located on the first side FS, the first inclined side surface 51 extends distally from the base substrate 10 (i.e., a direction from bottom to top in FIG. 3) and is inclined away from the second side SS, and a first space SP1 is formed between the first inclined side surface 51 and the base substrate 10. The partition structure 5 has a second inclined side surface 52 located on the second side SS, the second inclined side surface 52 extends distally from the base substrate 10 and is inclined away from the first side FS, and a second space SP2 is formed between the second inclined side surface 52 and the base substrate 10.

For example, as shown in FIG. 3, the first inclined side surface 51 and the second inclined side surface 52 are both inclined planes, that is, in a section perpendicular to the base substrate 10, the first inclined side surface 51 and the second inclined side surface 52 are respectively presented as inclined sides of the inverted trapezoid. However, the embodiments of the present disclosure are not limited thereto. The shapes of the first inclined side surface 51 and the second inclined side surface 52 are not limited to planes, but may be curved surfaces, which will be further described below with reference to the drawings.

Since the partition structure 5 has a section in a shape of an inverted trapezoid, when forming the light-emitting functional layer 40 by an evaporation process, the light-emitting functional layer 40 may be broken at each of the inclined side surfaces of the partition structure 5. As shown in FIG. 3, the light-emitting functional layer 40 is broken by two partition structures 5, and therefore includes a plurality of parts broken from each other, such as a first part 401, a second part 402, a third part 403, a fourth part 404, and a fifth part 405 shown in FIG. 3. The first part 401 and the second part 402 are broken at the first inclined side surface 51 of the partition structure 5 on the right, the second part 402 and the third part 403 are broken at the second inclined side surface 52 of the partition structure 5 on the right, the third part 403 and the fourth part 404 are broken at the first inclined side surface 51 of the partition structure 5 on the left, and the fourth part 404 and the fifth part 405 are broken at the second inclined side surface 52 of the partition structure 5 on the left. Since the light-emitting functional layer 40 includes a plurality of broken parts, water vapor and oxygen may fail to intrude the light-emitting device located in a space surrounded by the sealant 3 along the light-emitting functional layer 40. That is, an intrusion path for water vapor and oxygen may fail to be formed in the light-emitting functional layer 40. In this way, the encapsulation reliability of the display substrate may be improved.

In the embodiment shown in FIG. 3, both side surfaces of each of the two partition structures 5 are formed as the inclined side surfaces, that is, four inclined side surfaces are formed. However, the embodiments of the present disclosure are not limited thereto. In other embodiments, at least one side surface of at least one partition structure may be formed as the above-mentioned inclined side surface, so that the light-emitting functional layer 40 is broken at at least one part, thereby blocking an intrusion path for water vapor and oxygen. For example, one inclined side surface may be formed. A side surface on the first side or a side surface on the second side of the partition structure 5 on the right may be formed as the inclined side surface, or a side surface on the first side or a side surface on the second side of the partition structure 5 on the left may be formed as the inclined side surface. For example, two inclined side surfaces may be formed. The side surface on the second side of the partition structure 5 on the right and the side surface on the first side of the partition structure 5 on the left may be formed as the inclined side surfaces.

In the embodiment shown in FIG. 3, an overall section of the partition structure 5 is in a shape of an inverted trapezoid. In other words, the partition structure 5 includes a top surface 5P (i.e., an upper surface in FIG. 3) away from the base substrate 10, and the base substrate 10 includes a first surface 10P (i.e., an upper surface in FIG. 3) facing the partition structure 5. A vertical distance D1 from an end 51E of the first inclined side surface 51 away from the base substrate 10 to the first surface 10P is equal to a vertical distance D3 from the top surface 5P to the first surface 10P. A vertical distance D2 from an end 52E of the second inclined side surface 52 away from the base substrate 10 to the first surface 10P is equal to the vertical distance D3 from the top surface 5P to the first surface 10P. However, the embodiments of the present disclosure are not limited thereto. In other embodiments, a part of the section of the partition structure 5 may be in a shape of an inverted trapezoid.

Figure 4A:
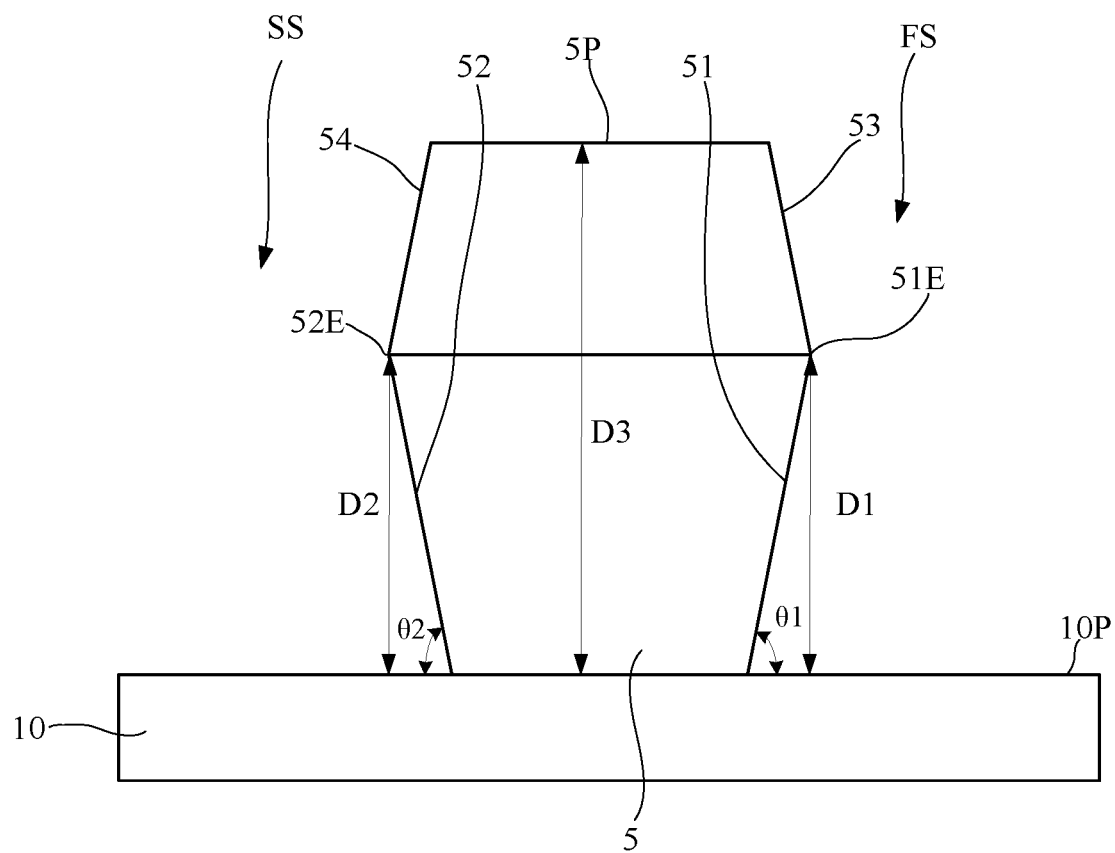
FIG. 4A and FIG. 4B each schematically shows a sectional view of a partition structure of a display substrate according to an embodiment of the present disclosure.
Figure 4B:
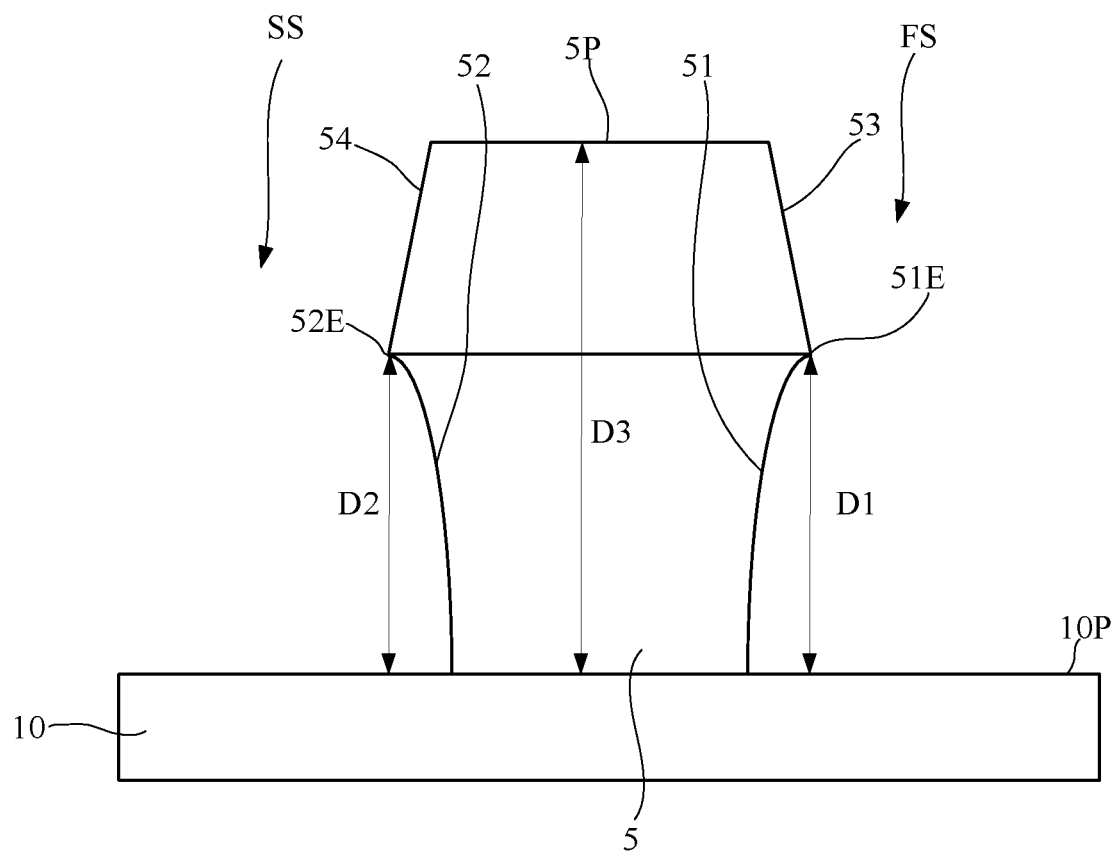

FIG. 4A and FIG. 4B each schematically shows a sectional view of a partition structure of a display substrate according to an embodiment of the present disclosure. As shown in FIG. 4A, the partition structure 5 includes the first inclined side surface 51 located on the first side FS and the second inclined side surface 52 located on the second side SS. In addition, the partition structure 5 further includes a third inclined side surface 53 located on the first side FS and a fourth inclined side surface 54 located on the second side SS. The third inclined side surface 53 extends distally from the base substrate 10 and is inclined toward the second side SS, and the third inclined side surface 53 intersects the first inclined side surface 51. The fourth inclined side surface 54 extends distally from the base substrate 10 and is inclined toward the first side FS, and the fourth inclined side surface 54 intersects the second inclined side surface 52. The vertical distance D1 from the end 51E of the first inclined side surface 51 away from the base substrate 10 to the first surface 10P is less than the vertical distance D3 from the top surface 5P to the first surface 10P. The vertical distance D2 from the end 52E of the second inclined side surface 52 away from the base substrate 10 to the first surface 10P is less than the vertical distance D3 from the top surface 5P to the first surface 10P. In this embodiment, since a lower part of the partition structure 5 is formed as an inverted trapezoidal structure, when the light-emitting functional layer 40 is formed by an evaporation process, the light-emitting functional layer 40 may still be broken at each of the inclined side surfaces of the partition structure 5.

For example, an acute angle θ1 formed between the first inclined side surface 51 and the base substrate 10 and an acute angle θ2 formed between the second inclined side surface 52 and the base substrate 10 may be in a range from 30° to 80°.

In an embodiment of the present disclosure, the first inclined side surface 51 and the second inclined side surface 52 may also be curved surfaces or arc surfaces, for example, including convex surfaces and concave surfaces. As shown in FIG. 4B, the first inclined side surface 51 and the second inclined side surface 52 are concave surfaces.

Referring back to FIG. 3, in an embodiment of the present disclosure, a section of the pixel definition layer 44 may have a shape of a regular trapezoid. The partition structure 5 and the pixel definition layer 44 may include the same material and may be formed by the same patterning process.

As shown in FIG. 3, the display substrate further includes a light guide structure 6 arranged on the base substrate 10. The light guide structure 6 is located in the encapsulation area ENA and arranged proximate to the partition structure 5. At least one light guide structure 6 is located on at least one side of the partition structure 5, for example, on the first side and/or the second side of the at least one partition structure 5. For example, in the embodiment shown in FIG. 3, one light guide structure 6 is provided, and the light guide structure 6 is located between two partition structures 5. That is, the light guide structure 6 is located on the second side of the partition structure 5 on the right and on the first side of the partition structure 5 on the left. The light guide structure 6 is configured to guide a light onto a part of the side surface of the partition structure 5 facing the light guide structure 6, so as to form the partition structure 5 in a shape of an inverted trapezoid or the partition structure 5 having a part in a shape of an inverted trapezoid.

Figure 5A:
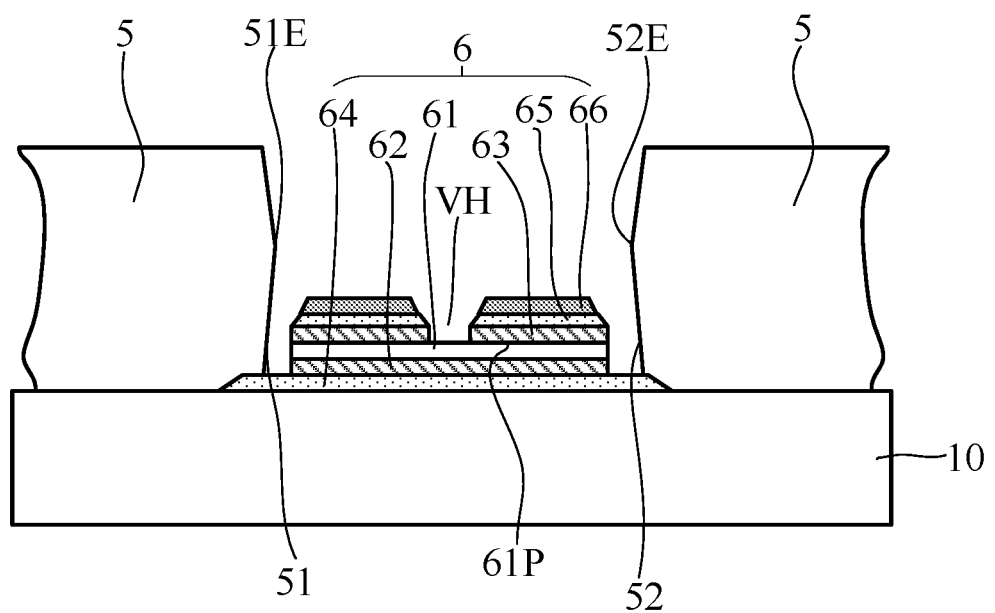
FIG. 5A and FIG. 5B each schematically shows a sectional view of a light guide structure included in a display substrate according to an embodiment of the present disclosure.
Figure 5B:
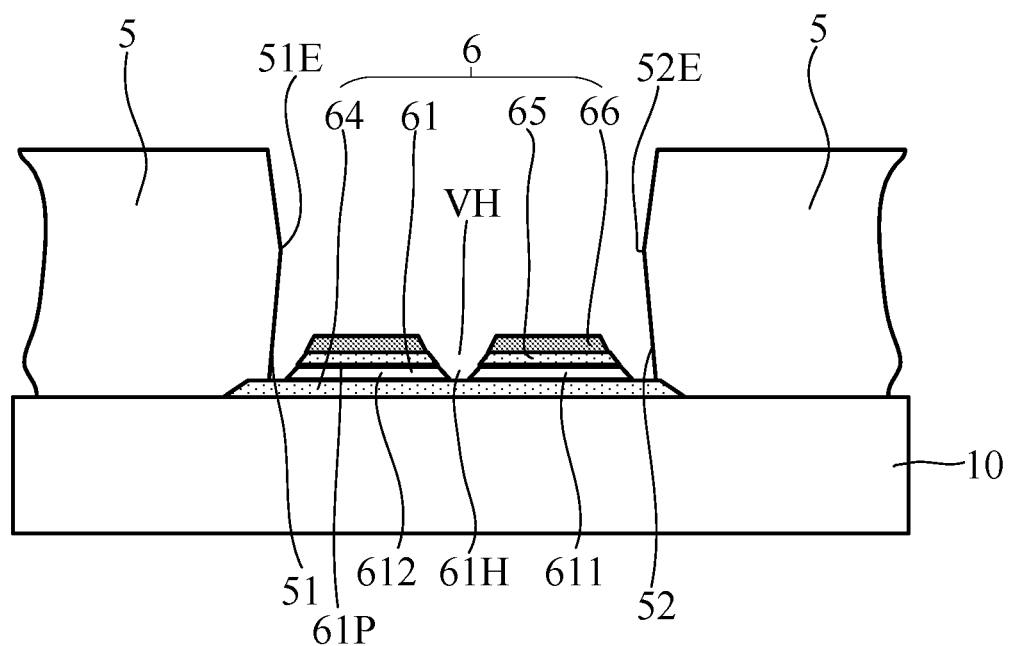

FIG. 5A and FIG. 5B each schematically shows a sectional view of a light guide structure included in a display substrate according to an embodiment of the present disclosure. In order to form the partition structure 5 in a shape of an inverted trapezoid, the light guide structure 6 may be formed on the base substrate 10 first. As shown in FIG. 5A and FIG. 5B, the light guide structure 6 may include: a first light reflection layer 64 provided on the base substrate; a first light guide layer 61 provided on a side of the first light reflection layer 64 away from the base substrate 10; and a second light reflection layer 65 provided on a side of the first light guide layer 61 away from the base substrate 10.

In some examples, the light guide structure 6 may further include: a second light guide layer 62 disposed between the first light reflection layer 64 and the first light guide layer 61; and a third light guide layer 63 disposed between the first light guide layer 61 and the second light reflection layer 65. A refractive index of a material of the first light guide layer 61 is greater than a refractive index of a material of the second light guide layer 62, and the refractive index of the material of the first light guide layer 61 is greater than a refractive index of a material of the third light guide layer 63.

For example, the material of the first light guide layer 6 may include a dielectric layer material with high transmittance and high refractive index, such as silicon nitride, silicon oxide, acrylic resin.

In some examples, the light guide structure 6 may further include a light absorption layer 66 disposed on a side of the second light reflection layer 65 away from the base substrate 10.

For example, referring to FIG. 5A, each of the light absorption layer 66, the second light reflection layer 65, and the third light guide layer 63 has an opening VH, where the openings VH of the light absorption layer 66, the second light reflection layer 65 and the third light guide layer 63 are communicated with each other to expose at least a part of the first light guide layer 61.

For example, referring to FIG. 5B, each of the light absorption layer 66 and the second light reflection layer 65 has an opening VH, and the opening VH of the light absorption layer 66 and the opening of the second light reflection layer 65 are communicated with each other to expose at least a part of the first light guide layer 61. The first light guide layer 61 has a spacing groove 61H that divides the first light guide layer 61 into a first light guide sub-layer 611 and a second light guide sub-layer 612. An orthographic projection of the spacing groove 61H on the base substrate 10 falls within each of an orthographic projection of the opening VH of the light absorbing layer 66 on the base substrate 10 and an orthographic projection of the opening VH of the second light reflection layer 65 on the base substrate 10.

Referring to FIG. 5A and FIG. 5B, the first light guide layer 61 includes a top surface 61P away from the base substrate 10. A vertical distance from the top surface 61P of the first light guide layer to the first surface 10P is less than each of the vertical distance from the end 51E of the first inclined side surface 51 away from the base substrate 10 to the first surface 10P and the vertical distance from the end 52E of the second inclined side surface 52 away from the base substrate 10 to the first surface 10P.

Figure 6:
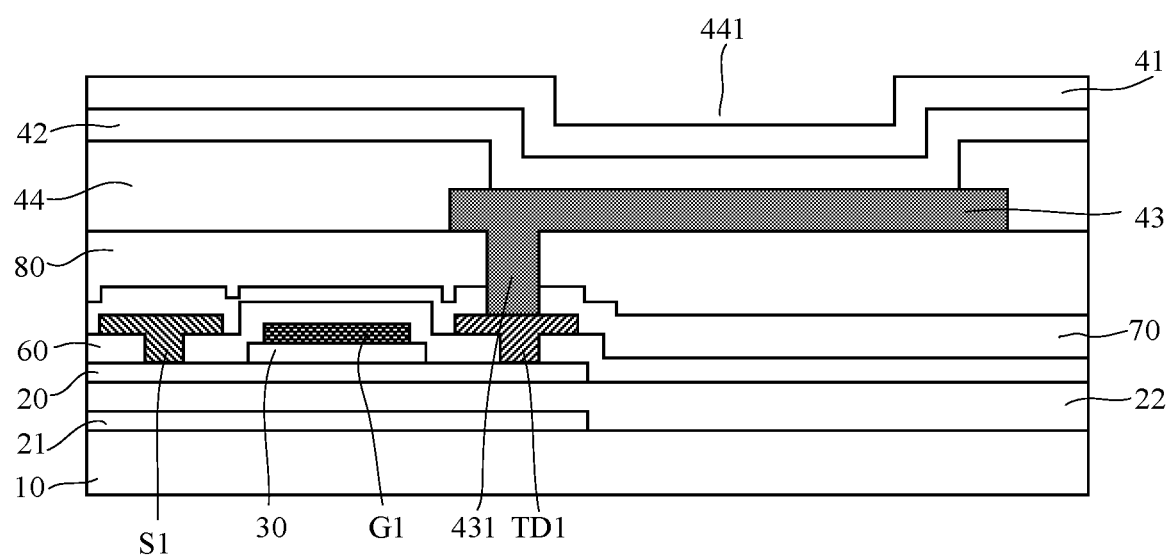
FIG. 6 schematically shows a sectional view of a display substrate in a display area according to an embodiment of the present disclosure.

FIG. 6 schematically shows a sectional view of a display substrate in a display area AA according to an embodiment of the present disclosure. As shown in FIG. 6, the display substrate 1 may include: an active layer 20 disposed on the base substrate 10, a first insulation layer (e.g., a gate insulation layer) 30 disposed on a side of the active layer 20 away from the base substrate 10, a gate electrode G1 disposed on a side of the first insulation layer 30 away from the base substrate 10, a second insulation layer (e.g., an interlayer insulation layer) 60 disposed on a side of the gate electrode G1 away from the base substrate 10, a source electrode S1 and a drain electrode TD1 that are disposed on a side of the second insulation layer 60 away from the base substrate 10, and a third insulation layer (e.g., a passivation layer) 70 covering the source electrode S1 and the drain electrode TD1. The source electrode S1 and the drain electrode TD1 are connected to the active layer 20 through via holes, respectively.

The display substrate may further include: a fourth insulation layer (e.g., a planarization layer) 80 disposed on a side of the third insulation layer 70 away from the base substrate 10. The second electrode 43 is electrically connected to the drain electrode TD1 through a via hole 431 formed in the third insulation layer 70 and the fourth insulation layer 80.

In an embodiment of the present disclosure, a thickness of the fourth insulation layer 80 is greater than a thickness of the third insulation layer 70. For example, the thickness of the third insulation layer 70 may be in a range from 3000 Å to 4000 Å (angstroms), and the thickness of the fourth insulation layer 80 may be in a range from 5000 Å to 8000 Å (angstroms).

For another example, the third insulation layer 70 and the fourth insulation layer 80 may include an inorganic insulation material, an organic insulation material, or any combination thereof. For example, the organic insulation material may include polyimide, polyamide, acrylic resin, phenol resin, benzocyclobutene, and the like.

The display substrate may further include the pixel definition layer 44 provided on a side of the second electrode 43 away from the base substrate 10. The pixel definition layer 44 may include an opening 441 located in each sub-pixel. The opening 441 exposes a part of the second electrode 43. A part of the light-emitting layer 42 fills the opening 441 so as to be in contact with the exposed part of the second electrode 43. The first electrode 41 is located on a side of the light-emitting layer 42 away from the base substrate 10.

In the illustrated exemplary embodiment, for ease of description, a layer where the gate electrode G1 is located may be referred to as a first conductive layer, a layer where the source electrode S1 and the drain electrode TD1 are located may be referred to as a second conductive layer, a layer where the second electrode 43 is located may be referred to as a third conductive layer, and a layer where the first electrode 41 is located may be referred to as a fourth conductive layer.

For example, the first conductive layer may be a conductive layer made of a gate material, the second conductive layer may be a conductive layer made of a source/drain material, the third conductive layer may be a conductive layer made of an anode material, and the fourth conductive layer may be a conductive layer made of a cathode material.

For example, the gate material may include a metal material, such as Mo, Al, Cu and other metals, and alloys thereof. The source/drain material may include a metal material, such as Mo, Al, Cu and other metals, and alloys thereof. The anode material may include a conductive metal material, such as magnesium, aluminum, lithium and other metals, and alloys thereof. The cathode material may include a transparent conductive material, such as indium tin oxide (ITO), indium zinc oxide (IZO), and the like.

Optionally, the display substrate may further include a light-shielding layer 21. The light-shielding layer 21 is disposed on a side of the active layer 20 proximate to the base substrate 10. An orthographic projection of the light-shielding layer 21 on the base substrate 10 covers an orthographic projection of the active layer 20 on the base substrate 10, so as to avoid an influence of external light on the active layer 20. The display substrate may further include a buffer layer 22 disposed between the light-shielding layer 21 and the active layer 20.

In embodiments of the present disclosure, a film layer in which the light guide structure 6 is located in the encapsulation area ENA may be located in the same layer as a film layer of a pixel unit located in the display area AA, so that the film layer of the pixel unit located in the display area AA and the film layer of the light guide structure 6 in the encapsulation area ENA may be simultaneously formed using the same patterning process. That is, the light guide structure 6 may be formed without an additional patterning process, which is beneficial to the simplification of a manufacturing process for the display substrate.

For example, the second insulation layer 60 may be located in the same layer as the first light guide layer 61. That is, the first light guide layer 61 may include an interlayer insulation layer material, which is beneficial to the formation of the first light guide layer 61 by using a material with a high refractive index.

For example, one of the light-shielding layer 21 and the first conductive layer may be located in the same layer as the first light reflection layer 64. That is, the first light reflection layer 64 includes a light-shielding layer metal material or a gate metal material.

For example, the first insulation layer 30 may be located in the same layer as the second light guide layer 62. That is, the second light guide layer 62 includes a gate insulation layer material.

For example, the third insulation layer 70 may be located in the same layer as the third light guide layer 63. That is, the third light guide layer 63 includes a passivation layer material or a resin material.

For example, one of the second conductive layer and the third conductive layer may be located in the same layer as the second light reflection layer 65. That is, the second light reflection layer 65 includes a source/drain metal material or an anode material.

A process flow of forming the partition structure 5 in a shape of an inverted trapezoid will be further described below with reference to the drawings. On this basis, a process flow of a method for manufacturing a display substrate according to an embodiment of the present disclosure will be further described below.

Figure 7:
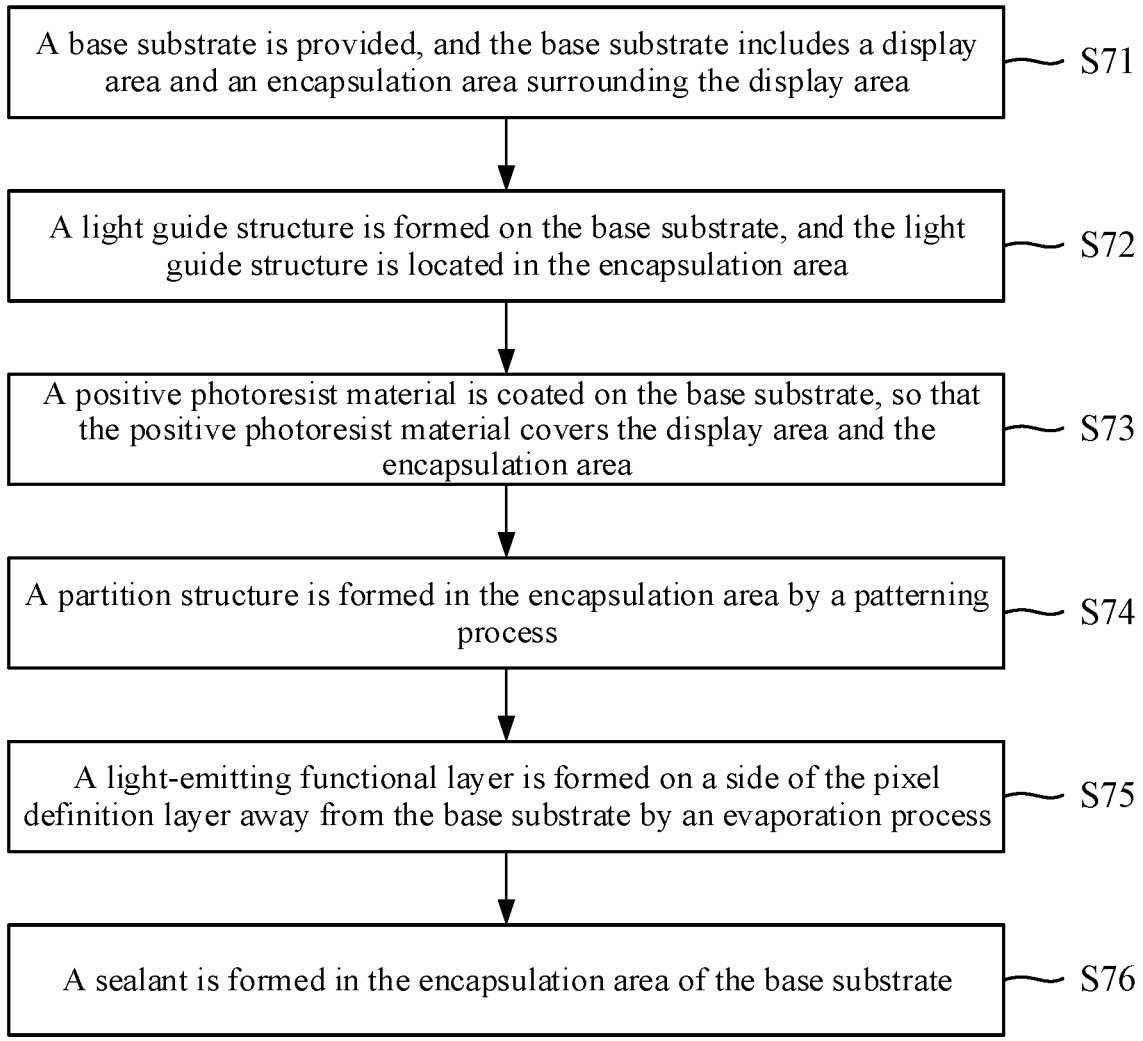
FIG. 7 shows a flowchart of a method for manufacturing a display substrate according to an embodiment of the present disclosure.

FIG. 7 shows a flowchart of a method for manufacturing a display substrate according to an embodiment of the present disclosure. FIG. 8 to FIG. 12 schematically show some process steps of the method for manufacturing a display substrate according to embodiments of the present disclosure, respectively. Referring to FIG. 7 to FIG. 12 in combination, the method for manufacturing the display substrate may include the following steps.

In step S71, a base substrate 10 is provided, and the base substrate 10 includes a display area NA and an encapsulation area ENA surrounding the display area.

In step S72, a light guide structure 6 is formed on the base substrate 10, and the light guide structure 6 is located in the encapsulation area ENA.

Figure 8:
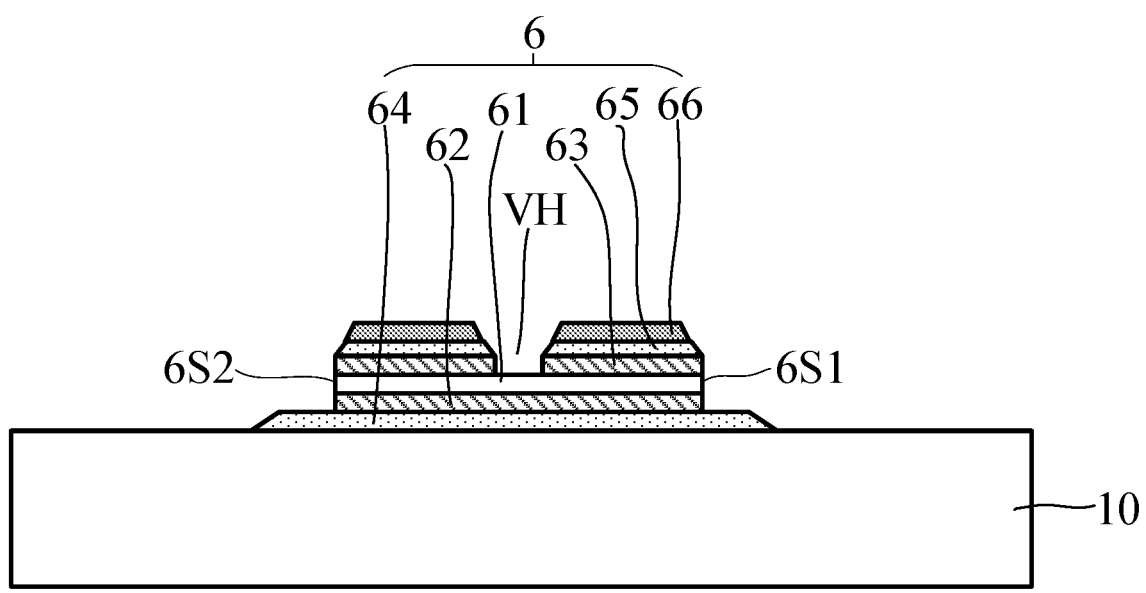
FIG. 8 to FIG. 12 schematically show some process steps of a method for manufacturing a display substrate according to embodiments of the present disclosure, respectively.

As shown in FIG. 8, the light guide structure 6 has a first side surface 6S1 and a second side surface 6S2 that are opposite to each other. One of the first side surface 6S1 and the second side surface 6S2 is proximate to the display area AA, and the other one of the first side surface 6S1 and the second side surface 6S2 is away from the display area AA.

In some embodiments of the present disclosure, step S72 may include: forming a first light reflection layer 64 on the base substrate 10; forming a second light guide layer 62 on a side of the first light reflection layer 64 away from the base substrate 10; forming a first light guide layer 61 on a side of the second light guide layer 62 away from the base substrate 10; forming a third light guide layer 63 on a side of the first light guide layer 61 away from the base substrate 10; and forming a second light reflection layer 65 on a side of the third light guide layer 63 away from the base substrate 10. A refractive index of a material of the first light guide layer 61 is greater than a refractive index of a material of the second light guide layer 62, and the refractive index of the material of the first light guide layer 61 is greater than a refractive index of a material of the third light guide layer 63.

Figure 11:
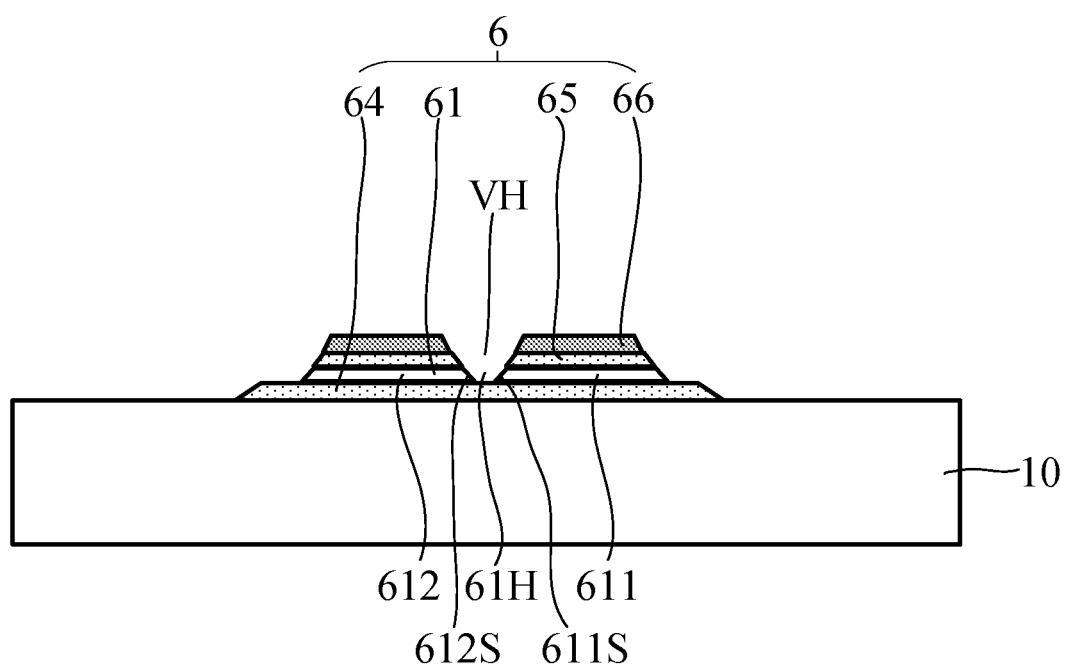

In some embodiments of the present disclosure, as shown in FIG. 11, step S72 may include: forming a first light reflection layer 64 on the base substrate 10; forming a first light guide layer 61 on a side of the first light reflection layer 64 away from the base substrate 10; and forming a second light reflection layer 65 on a side of the first light guide layer 61 away from the base substrate 10.

In some embodiments of the present disclosure, step S72 may further include: forming a light absorption layer 66 on a side of the second light reflection layer 65 away from the base substrate 10.

It will be noted that the first light reflection layer 64, the second light guide layer 62, the first light guide layer 61, the third light guide layer 63, the second light reflection layer 65, and the light absorption layer 66 of the light guide structure 6 may be respectively formed by the same patterning processes or film forming processes as some film layers in the display area AA. That is, the light guide structure 6 may be formed without an additional patterning process, which is beneficial to the simplification of a manufacturing process of the display substrate.

For example, referring to FIG. 8, step S72 may further include: forming an opening VH in each of the light absorption layer 66, the second light reflection layer 65, and the third light guide layer 63, and the openings VH of the light absorption layer 66, the second light reflection layer 65 and the third light guide layer 63 are communicated with each other to expose at least a part of the first light guide layer 61. For example, each of orthographic projections of the openings VH of the light absorption layer 66, the second light reflection layer 65, and the third light guide layer 63 on the first light guide layer 61 may be located at substantially a middle position of the first light guide layer 61 in a horizontal direction as shown in FIG. 8.

For example, referring to FIG. 11, step S72 may further include: forming an opening VH in each of the light absorption layer 66 and the second light reflection layer 65, where the openings VH of the light absorption layer 66 and the second light reflection layer 65 are communicated with each other to expose at least a part of the first light guide layer 61. For example, each of an orthographic projection of the opening VH of the light absorption layer 66 on the first light guide layer 61 and an orthographic projection of the opening VH of the second light reflection layer 65 on the first light guide layer 61 may be located at substantially the middle position of the first light guide layer 61 in the horizontal direction shown in FIG. 8.

Step S72 may further include: forming a spacing groove 61H in the first light guide layer 61, so that the spacing groove 61H divides the first light guide layer 61 into a first light guide sub-layer 611 and a second light guide sub-layer 612. The first light guide sub-layer 611 has a first side wall 611S facing the second light guide sub-layer 612, and the second light guide sub-layer 612 has a second side wall 612S facing the first light guide sub-layer 611. The first side wall 611S and the second side wall 612S are spaced apart from each other by a certain distance.

Figure 9:
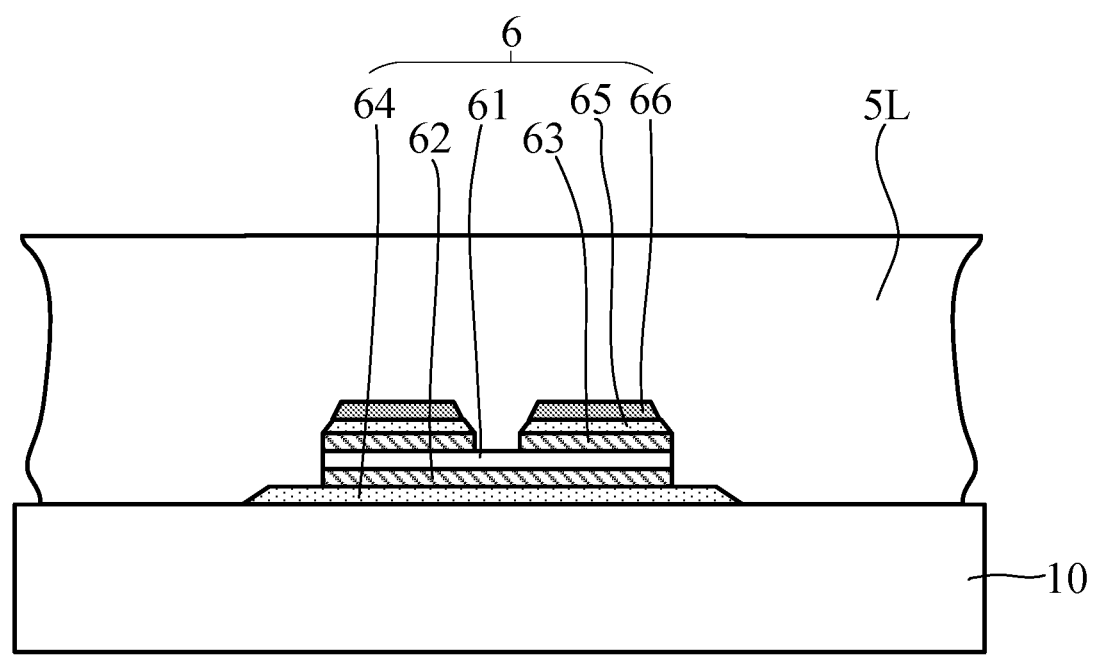

In step S73, as shown in FIG. 9, a positive photoresist material 5L is coated onto the base substrate 10, so that the positive photoresist material 5L covers the display area AA and the encapsulation area ENA. As shown in FIG. 9, the positive photoresist material 5L covers the light guide structure 6.

In step S74, a partition structure 5 is formed in the encapsulation area ENA by a patterning process.

In an embodiment of the present disclosure, step S74 may be performed based on the following steps.

Figure 10:
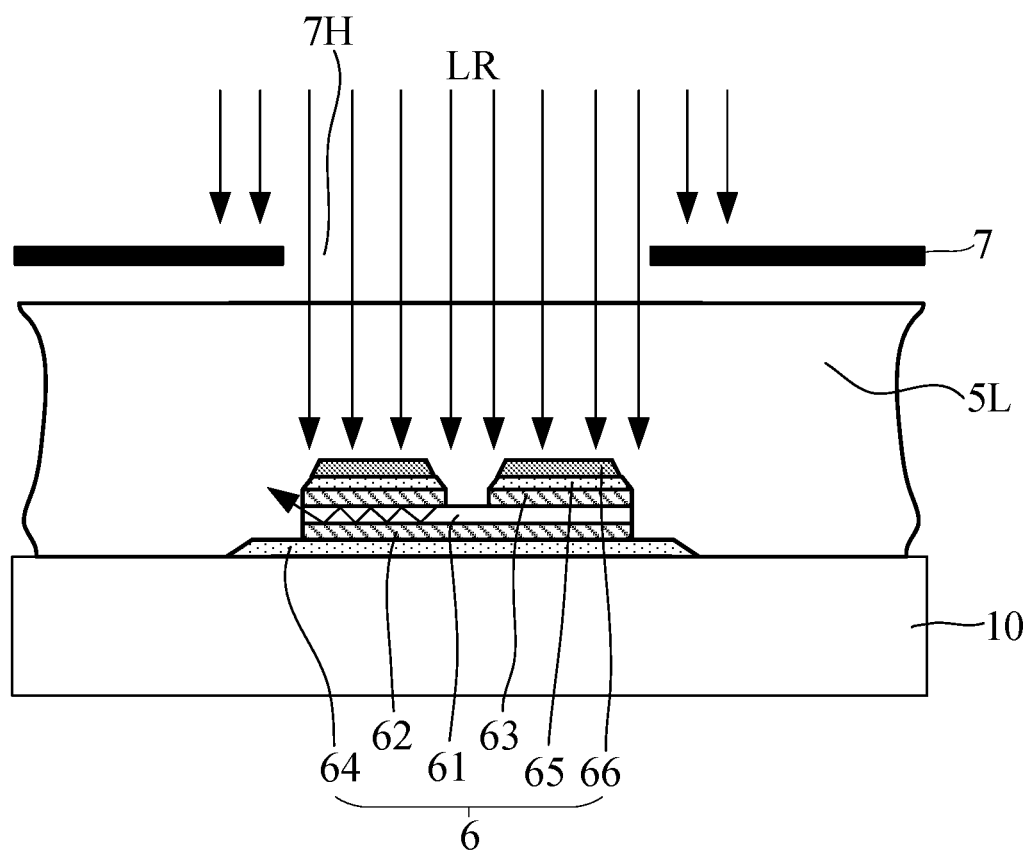

As shown in FIG. 10, the partition structure 5 is formed by a patterning process using a mask 7. Specifically, light (e.g., ultraviolet light) LR is irradiated to a part of the positive photoresist material 5L and to the light guide structure 6 through an opening 7H of the mask 7.

Under a guidance of the light guide structure 6, a part of the light is emitted from the first side surface 6S1 and the second side surface 6S2 of the light guide structure 6, so as to be irradiated to parts of the positive photoresist material 5L respectively facing the first side surface 6S1 and the second side surface 6S2.

For example, referring to FIG. 8 to FIG. 10 in combination, the light LR is irradiated to the first light guide layer 61 through the opening 7H of the mask, and each of the openings VH of the light absorption layer 66, the second light reflection layer 65 and the third light guide layer 63, so that the light is introduced into the first light guide layer 61. Since the refractive index of the material of the first light guide layer 61 is greater than each of the refractive indexes of the materials of the second light guide layer 62 and the third light guide layer 63, total reflection may occur at an interface between the first light guide layer 61 and the second light guide layer 62 and an interface between the first light guide layer 61 and the third light guide layer 63 during a propagation of the light within the first light guide layer 61. Further, a part of the light not totally reflected may be reflected back into the first light guide layer 61 by the first light reflection layer 64 and the second light reflection layer 65, so that the light is kept propagating within the first light guide layer 61. In this way, in the embodiment shown in FIG. 10, the light propagating in the first light guide layer 61 may be respectively emitted from the first side surface 6S1 and the second side surface 6S2 of the light guide structure 6, so as to be respectively irradiated to a part of the positive photoresist material 5L facing the first side surface 6S1 and a part of the positive photoresist material 5L facing the second side surface 6S2.

For example, in the embodiment shown in FIG. 11, the light LR is irradiated to the first light guide layer 61 through the opening 7H of the mask and each of the openings VH of the light absorption layer 66 and the second light reflection layer 65, so that the light is introduced into the first light guide layer 61. In this embodiment, since the spacing groove 61H is provided, a part of the light may enter the first light guide layer 61 through the first side wall 611S and the second side wall 612S, that is, from side surfaces. During the propagation of the light in the first light guide layer 61, a downward propagating light and an upward propagating light may be reflected back into the first light guiding layer 61 by the first light reflection layer 64 and the second light reflection layer 65 respectively, so that the light is kept propagating within the first light guide layer 61. In this way, in the embodiment shown in FIG. 11, the light propagating in the first light guide layer 61 may be emitted from the first side surface 6S1 and the second side surface 6S2 of the light guide structure 6 respectively, so as to be irradiated to parts of the positive photoresist material 5L respectively facing the first side surface 6S1 and the second side surface 6S2.

For example, a small part of the light that is neither totally reflected nor reflected by the light reflection layer may be absorbed by the light absorption layer 66 during a process of being emitted upward. Therefore, luminous fluxes of the light received by the parts of the positive photoresist material 5L facing the first side surface 6S1 and the second side surface 6S2 is greater than a luminous flux of the light received by a part of the positive photoresist material 5L not facing the first side surface 6S1 and the second side surface 6S2, such that so that the partition structure 5 in a shape of an inverted trapezoid or the partition structure 5 having a part in a shape of an inverted trapezoid may be formed.

Figure 12:
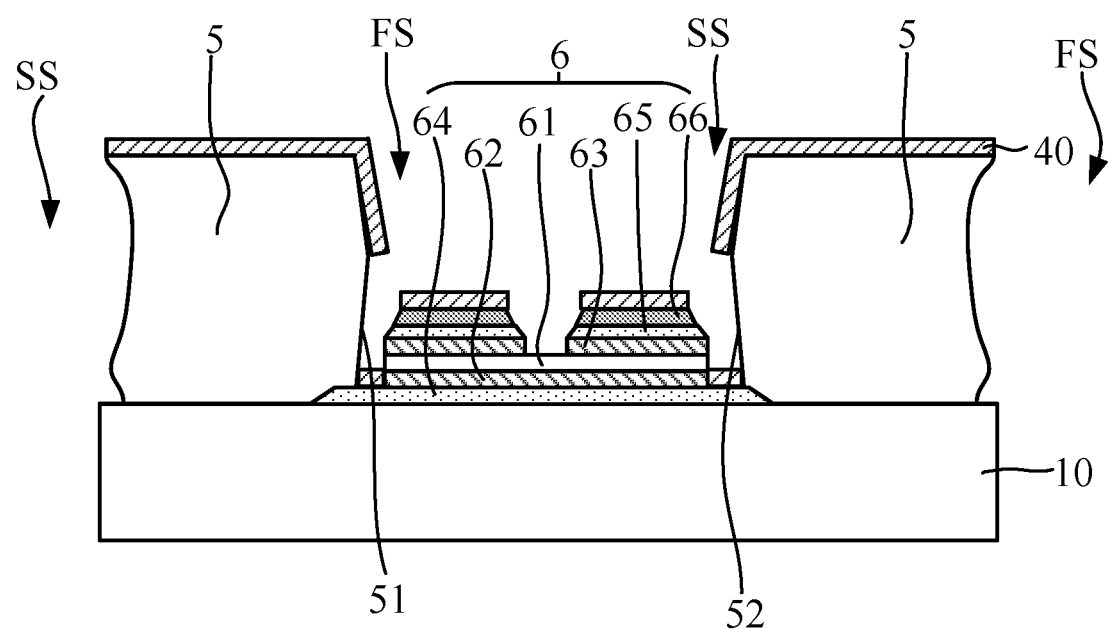

A development process is performed on the exposed positive photoresist material 5L, so as to form the partition structure 5 in the encapsulation area ENA. In this step, exposed parts of the positive photoresist material 5L is removed in the development process. The luminous fluxes of the light received by the parts of the positive photoresist material 5L facing the first side surface 6S1 and the second side surface 6S2 is greater than the luminous flux of the light received by the part of the positive photoresist material 5L not facing the first side surface 6S1 and the second side surface 6S2. That is, widths of exposed parts of the positive photoresist material 5L facing the first side surface 6S1 and the second side surface 6S2 are greater than a depth of an exposed part of the positive photoresist material 5L not facing the first side surface 6S1 and the second side surface 6S2. Therefore, the parts of the positive photoresist material 5L facing the first side surface 6S1 and the second side surface 6S2 have material removal with a larger width, and material removal from the part of the positive photoresist material 5L not facing the first side surface 6S1 and the second side surface 6S2 has material removal with a smaller width. In this way, the partition structure 5 is formed such that the partition structure 5 or a part of the partition structure 5 has a shape of an inverted trapezoid, as shown in FIG. 12.

As described above, each partition structure 5 has the first side FS and the second side SS facing each other. Referring to FIG. 3 and FIG. 12 in combination, the partition structure 5 on the right has the first inclined side surface 51 located on the first side FS of the partition structure 5, where the first inclined side surface 51 is inclined away from the second side SS in the direction from the side proximate to the base substrate 10 to the side away from the base substrate 10, and the first space SP1 is formed between the first inclined side surface 51 and the base substrate 10. The partition structure 5 on the left has the second inclined side surface 52 located on the second side SS of the partition structure 5, where the second inclined side surface 52 is inclined away from the first side FS in the direction from the side proximate to the base substrate 10 to the side away from the base substrate 10, and the second space SP2 is formed between the second inclined side surface 52 and the base substrate 10.

Based on an actual exposure amount, an exposure time and other factors, the first inclined side surface 51 of the partition structure 5 on the right and the second inclined side surface 52 of the partition structure 5 on the left may be formed as shown in FIG. 4A or FIG. 4B, or may be formed as shown in FIG. 3.

In an embodiment of the present disclosure, in the patterning process, the pixel definition layer 44 may be further formed in the display area AA. That is, the pixel definition layer 44 and the partition structure 5 are formed by the same patterning process. In other words, in the embodiments of the present disclosure, by providing the light guide structure 6, the normal trapezoidal pixel definition layer 44, and the partition structure 5 in a shape of an inverted trapezoid or the partition structure 5 having a part in a shape of an inverted trapezoid may be formed in the display area AA by the same patterning process.

In step S75, a light-emitting functional layer 40 is formed on a side of the pixel definition layer 44 away from the base substrate 10 by an evaporation process. For example, the light-emitting functional layer 40 may include at least a light-emitting layer 42, or the light-emitting functional layer 40 may include a light-emitting layer 42 and a second electrode 41. Since some side surfaces of the partition structure 5 are inclined surfaces that are wide at the top and narrow at the bottom, such as the first inclined side surface 51 and the second inclined side surface 52, the light-emitting functional layer 40 is broken at least at these inclined side surfaces, as shown in FIG. 12.

In step S76, a sealant 3 is formed in the encapsulation area ENA of the base substrate 10. An orthographic projection of the sealant 3 on the base substrate 10 covers each of orthographic projections of the partition structure 5 and the light guide structure 6 on the base substrate 10.

It will be noted that according to some embodiments of the present disclosure, some steps in the above manufacturing method may be performed separately or in combination, and may be performed in parallel or in sequence, which is not limited to the specific operation order shown in FIG. 7.

Figure 13:
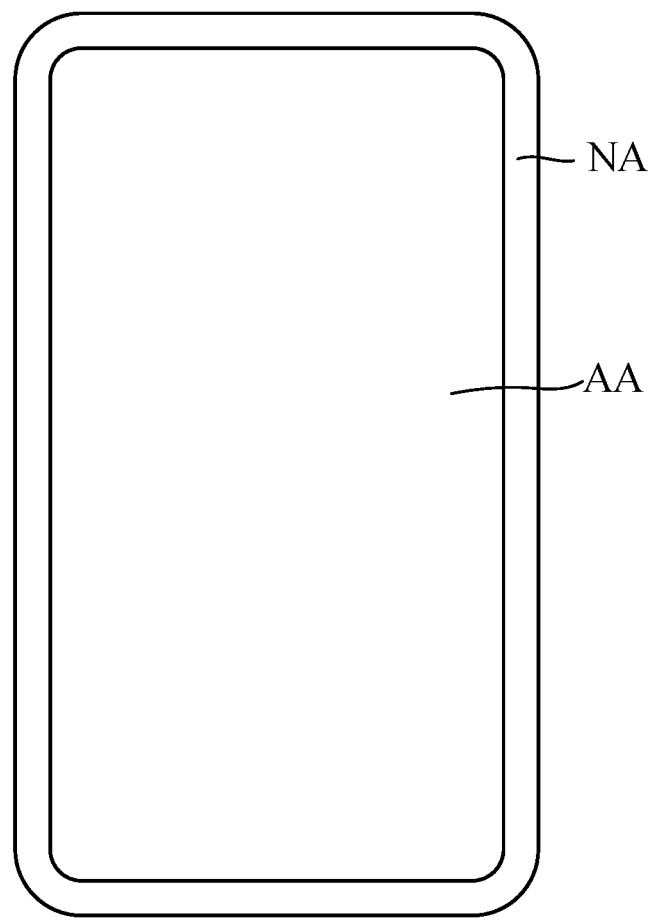
FIG. 13 shows a schematic diagram of a display apparatus according to some exemplary embodiments of the present disclosure.

FIG. 13 shows a schematic diagram of a display apparatus according to some exemplary embodiments of the present disclosure. The display apparatus 100 includes the above-mentioned display panel. For example, it may include the display area AA and the peripheral area NA. For the film layer structure in the display area AA and the peripheral area NA, reference may be made to the description of the respective embodiments described above, which will not be repeated here.

The display apparatus may include any device or product with a display function. For example, the display apparatus may be a smart phone, a mobile phone, an e-book reader, a personal computer (PC), a laptop PC, a netbook PC, a personal digital assistant (PDA), a portable multimedia player (PMP), a digital audio player, a mobile medical apparatus, a camera, a wearable device (such as a head-mounted device, electronic clothing, electronic bracelet, electronic necklace, electronic accessory, electronic tattoo, or smart watch), a television, etc.

It will be understood that the display apparatus according to the embodiments of the present disclosure has all the features and advantages of the display substrate and the display panel described above. Details may be referred to the above description.

Although some embodiments of a general technical concept of the present disclosure have been illustrated and described, it will be understood by those ordinary skilled in the art that these embodiments may be changed without departing from the principle and spirit of the general technical concept of the present disclosure. The scope of the present disclosure is defined by the claims and their equivalents.

What is claimed is:

1. A display substrate, comprising:
a base substrate, comprising a display area and an encapsulation area surrounding the display area, wherein the encapsulation area is configured to accommodate a sealant;
a partition structure disposed on the base substrate and located in the encapsulation area, wherein the partition structure has a first side and a second side opposite to each other, one of the first side and the second side is proximate to the display area, and the other of the first side and the second side is away from the display area, and
a light guide structure disposed on the base substrate, wherein the light guide structure is located in the encapsulation area and arranged proximate to the partition structure,
wherein at least one light guide structure is located on the first side of the partition structure and configured to guide light onto a part, which faces the light guide structure, of a side surface of the partition structure on the first side; and
wherein the partition structure has a first inclined side surface located on the first side, wherein the first inclined side surface extends distally from the base substrate and is inclined away from the second side, and a first space is formed between the first inclined side surface and the base substrate.

2. The display substrate of claim 1, wherein the light guide structure comprises:
a first light reflection layer disposed on the base substrate;
a first light guide layer disposed on a side of the first light reflection layer away from the base substrate; and
a second light reflection layer disposed on a side of the first light guide layer away from the base substrate.

3. The display substrate of claim 2, wherein the light guide structure further comprises:
a second light guide layer disposed between the first light reflection layer and the first light guide layer; and
a third light guide layer disposed between the first light guide layer and the second light reflection layer,
wherein a refractive index of a material of the first light guide layer is greater than a refractive index of a material of the second light guide layer, and the refractive index of the material of the first light guide layer is greater than a refractive index of a material of the third light guide layer.

4. The display substrate of claim 2, wherein the light guide structure further comprises a light absorption layer disposed on a side of the second light reflection layer away from the base substrate.

5. The display substrate of claim 4, wherein each of the light absorption layer, the second light reflection layer, and the third light guide layer has an opening, wherein the opening of the light absorption layer, the opening of the second light reflection layer, and the opening of the third light guide layer are communicated with each other to expose at least a part of the first light guide layer.

6. The display substrate of claim 5, wherein the first light guide layer has a spacing groove dividing the first light guide layer into a first light guide sub-layer and a second light guide sub-layer, and an orthographic projection of the spacing groove on the base substrate falls within each of orthographic projections of the openings of the light absorption layer, the second light reflection layer, and the third light guide layer on the base substrate.

7. The display substrate of claim 1, wherein the partition structure comprises a top surface away from the base substrate, the base substrate comprises a first surface facing the partition structure, and a vertical distance from an end of the first inclined side surface away from the base substrate to the first surface is less than or equal to a vertical distance from the top surface to the first surface.

8. The display substrate of claim 7, wherein the partition structure further comprises a second inclined side surface located on the second side, wherein the second inclined side surface is inclined away from the first side in a direction from the side proximate to the base substrate to the side away from the base substrate, and a second space is formed between the second inclined side surface and the base substrate.

9. The display substrate of claim 8, wherein a vertical distance from an end of the second inclined side surface away from the base substrate to the first surface is less than or equal to the vertical distance from the top surface to the first surface.

10. The display substrate of claim 9, wherein the first light guide layer comprises a top surface away from the base substrate, and a vertical distance from the top surface of the first light guide layer to the first surface is less than each of the vertical distance from the end of the first inclined side surface away from the base substrate to the first surface and the vertical distance from the end of the second inclined side surface away from the base substrate to the first surface.

11. The display substrate of claim 4, wherein the display substrate further comprises a plurality of pixel units disposed in the display area of the base substrate, and each of the pixel units comprises a pixel driver circuit, and a light-emitting device electrically connected to the pixel driver circuit, wherein the light-emitting device comprises a first electrode, a second electrode, and a light-emitting layer disposed between the first electrode and the second electrode; and wherein the pixel driver circuit comprises at least one thin film transistor disposed on the base substrate, and the thin film transistor comprises an active layer, a gate electrode, a source electrode, and a drain electrode; and
wherein the display substrate further comprises: a light-shielding layer disposed on a side of the active layer proximate to the base substrate; a first conductive layer disposed on a side of the active layer away from the base substrate, wherein the gate electrode is located in the first conductive layer; a second conductive layer disposed on a side of the first conductive layer away from the base substrate, wherein the source electrode and the drain electrode are located in the second conductive layer; a third conductive layer disposed on a side of the second conductive layer away from the base substrate, wherein the second electrode is located in the third conductive layer; a first insulation layer disposed between the active layer and the first conductive layer; a second insulation layer disposed between the first conductive layer and the second conductive layer; and a third insulation layer disposed between the second conductive layer and the third conductive layer, wherein the second insulation layer is located in a same layer as the first light guide layer.

12. The display substrate of claim 11, wherein one of the light-shielding layer and the first conductive layer is located in a same layer as the first light reflection layer; and/or
the first insulation layer is located in a same layer as the second light guide layer; and/or
the third insulation layer is located in a same layer as the third light guide layer; and/or
one of the second conductive layer and the third conductive layer is located in a same layer as the second light reflection layer.

13. The display substrate of claim 1, wherein the display substrate comprises at least two partition structures, and at least one light guide structure is located between two partition structures.

14. The display substrate of claim 1, wherein the display substrate comprises at least two light guide structures, at least one light guide structure is located on the first side of the partition structure, and at least one light guide structure is located on the second side of the partition structure.

15. The display substrate of claim 11, wherein the display substrate further comprises a pixel definition layer located on a side of the first electrode away from the base substrate; and
the partition structure and the pixel definition layer are located in a same layer.

16. The display substrate of claim 15, wherein the partition structure comprises a positive photoresist material.

17. The display substrate of claim 1, wherein the display substrate further comprises a sealant located in the encapsulation area, and an orthographic projection of the sealant on the base substrate covers each of an orthographic projection of the partition structure on the base substrate and an orthographic projection of the light guide structure on the base substrate.

18. The display substrate of claim 11, wherein each of the second electrode and the light-emitting layer of the light-emitting device is broken at at least the first inclined side surface.

19. A display apparatus, comprising:
the display substrate of claim 1; and
a second substrate facing the display substrate,
wherein the encapsulation area is provided with a sealant in contact with the display substrate and the second substrate respectively.

20. A method for manufacturing a display substrate, comprising:
providing a base substrate, wherein the base substrate comprises a display area, and an encapsulation area surrounding the display area;
forming a light guide structure on the base substrate, wherein the light guide structure is located in the encapsulation area, and has a first side surface and a second side surface opposite to each other, one of the first side surface and the second side surface is proximate to the display area, and the other of the first side surface and the second side surface is away from the display area;
coating a positive photoresist material onto the base substrate, wherein the positive photoresist material covers the display area and the encapsulation area; and
forming a partition structure in the encapsulation area by a patterning process,
wherein the forming a partition structure in the encapsulation area by a patterning process comprises:
irradiating light to a part of the positive photoresist material and to the light guide structure, through an opening of a mask;
under a guidance of the light guide structure, a part of the light is emitted from the first side surface and the second side surface of the light guide structure to be irradiated to a part of the positive photoresist material facing the first side surface and the second side surface; and
performing a development process on the exposed positive photoresist material to from the partition structure in the encapsulation area, such that: the partition structure has a first side and a second side facing each other, the partition structure has a first inclined side surface located on the first side, the first inclined side surface is inclined away from the second side in a direction from a side proximate to the base substrate to a side away from the base substrate, and a first space is formed between the first inclined side surface and the base substrate, wherein one of the first side and the second side is proximate to the display area, and the other of the first side and the second side is away from the display area.

* * * * *